(12) United States Patent
Kim et al.

(10) Patent No.: US 11,355,573 B2
(45) Date of Patent: *Jun. 7, 2022

(54) DISPLAY APPARATUS

(71) Applicant: SAMSUNG DISPLAY CO., LTD., Yongin-si (KR)

(72) Inventors: Dongsoo Kim, Yongin-si (KR); Wonkyu Kwak, Yongin-si (KR); Kwangmin Kim, Yongin-si (KR); Kiwook Kim, Yongin-si (KR); Joongsoo Moon, Yongin-si (KR); Hyunae Park, Yongin-si (KR); Jieun Lee, Yongin-si (KR); Changkyu Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

This patent is subject to a terminal disclaimer.

(21) Appl. No.: 16/589,506

(22) Filed: Oct. 1, 2019

(65) Prior Publication Data

US 2020/0035775 A1 Jan. 30, 2020

Related U.S. Application Data

(63) Continuation of application No. 15/831,577, filed on Dec. 5, 2017, now Pat. No. 10,439,017.

(30) Foreign Application Priority Data

Apr. 26, 2017 (KR) .................. 10-2017-0053884

(51) Int. Cl.
*H01L 27/32* (2006.01)
*H01L 51/00* (2006.01)
(Continued)

(52) U.S. Cl.
CPC ...... *H01L 27/3276* (2013.01); *H01L 27/1218* (2013.01); *H01L 51/0097* (2013.01);
(Continued)

(58) Field of Classification Search
CPC . H01L 27/3244; H01L 27/3241; H01L 33/62; H01L 24/97; H01L 27/3211; H01L 27/3276
See application file for complete search history.

(56) References Cited

U.S. PATENT DOCUMENTS 8,933,451 B2  1/2015 Kim et al.
9,287,342 B2  3/2016 Kwon et al.
(Continued)

FOREIGN PATENT DOCUMENTS

KR  10-2008-0031091  4/2008
KR  10-2012-0044019  5/2012
(Continued)

OTHER PUBLICATIONS

KR 10-2014-0129647_English Translation of Relevant Part.
Office Action for U.S. Appl. No. 16/589,549 dated Jun. 24, 2021.

*Primary Examiner* — Hoa B Trinh
(74) *Attorney, Agent, or Firm* — F. Chau & Associates, LLC

(57) ABSTRACT

A display apparatus includes a substrate having a first area, a second area, and a bending area disposed therebetween. The substrate is bent at the bending area about a bending axis. An inorganic insulating layer is disposed over the substrate and includes an opening or groove corresponding to the bending area. An organic material layer fills the opening or groove. A first conductive layer extends from the first area to the second area through the bending area. The first conductive layer is disposed over the organic material layer and includes a multipath portion having a plurality of through holes. A length of the multipath portion, in a direction from the first area to the second area, is greater than a width of the opening or groove, in the direction from the first area to the second area.

18 Claims, 8 Drawing Sheets

(51) Int. Cl.
  *H01L 51/52* (2006.01)
  *H01L 27/12* (2006.01)
  *H01L 51/56* (2006.01)

(52) U.S. Cl.
  CPC ........ *H01L 51/5253* (2013.01); *H01L 27/124* (2013.01); *H01L 27/3258* (2013.01); *H01L 27/3262* (2013.01); *H01L 51/5237* (2013.01); *H01L 51/5281* (2013.01); *H01L 51/56* (2013.01); *H01L 2227/323* (2013.01); *H01L 2251/5338* (2013.01); *H01L 2251/566* (2013.01)

(56) References Cited

U.S. PATENT DOCUMENTS

| | | | |
|---|---|---|---|
| 10,429,017 | B2 | 10/2019 | Cohen et al. |
| 10,439,017 | B2 * | 10/2019 | Kim .................. H01L 51/5253 |
| 2008/0079889 | A1 | 4/2008 | Lee et al. |
| 2014/0307396 | A1 | 10/2014 | Lee |
| 2016/0079333 | A1 * | 3/2016 | Shishido ............. H01L 27/3244 257/72 |
| 2017/0062485 | A1 | 3/2017 | Kwon et al. |
| 2017/0262109 | A1 | 9/2017 | Choi et al. |
| 2017/0288009 | A1 | 10/2017 | Kim et al. |
| 2017/0294620 | A1 | 10/2017 | Park et al. |
| 2018/0061917 | A1 * | 3/2018 | Kim .................... H01L 51/0097 |
| 2018/0076236 | A1 | 3/2018 | Kwon et al. |
| 2018/0270950 | A1 * | 9/2018 | Park ..................... H05K 1/113 |
| 2018/0286938 | A1 * | 10/2018 | Moon ................ H01L 27/1248 |
| 2018/0315809 | A1 | 11/2018 | Kim et al. |
| 2019/0189035 | A1 * | 6/2019 | Ochi .................. H01L 51/5012 |

FOREIGN PATENT DOCUMENTS

| | | |
|---|---|---|
| KR | 10-2014-0103025 | 8/2014 |
| KR | 10-2014-0129647 | 11/2014 |
| KR | 10-2015-0074808 | 7/2015 |
| KR | 10-2017-0096089 | 8/2017 |
| KR | 10-2017-0114040 | 10/2017 |
| KR | 10-2017-0115213 | 10/2017 |
| WO | 2014/126403 | 8/2014 |

* cited by examiner

DISPLAY APPARATUS

CROSS-REFERENCE TO RELATED APPLICATION

This application is a Continuation of co-pending U.S. patent application Ser. No. 15/831,577, filed on Dec. 5, 2017, which claims priority to Korean Patent Application No. 10-2017-0053884, filed on Apr. 26, 2017, in the Korean Intellectual Property Office, the disclosures of which are incorporated by reference herein in their entirety.

TECHNICAL FIELD

The present disclosure relates to a display apparatus, and more particularly, to a display apparatus in which the generation of defects is reduced during manufacture or in subsequent use.

DISCUSSION OF THE RELATED ART

A display apparatus is a device that is capable of displaying an image. While many display apparatuses include a rigid display panel, more recently, display apparatuses have been built to have flexible display panels so that at least a part of the display apparatus may be bent to improve visibility at various angles, or to reduce the size of a non-display area of the display panel.

However, in manufacturing display apparatuses with flexible display panels, defects may occur at or in the vicinity of a bending portion, either during the process of manufacturing the display apparatus or in subsequent use.

SUMMARY

A display apparatus includes a substrate having a first area, a second area, and a bending area disposed therebetween. The substrate is bent at the bending area about a bending axis. An inorganic insulating layer is disposed over the substrate and includes an opening or groove corresponding to the bending area. An organic material layer fills the opening or groove. A first conductive layer extends from the first area to the second area through the bending area. The first conductive layer is disposed over the organic material layer and includes a multipath portion having a plurality of through holes. A length of the multipath portion, in a direction from the first area to the second area, is greater than a width of the opening or groove, in the direction from the first area to the second area.

A display apparatus includes a substrate having a first area, a second area, and a bending area disposed therebetween. The substrate is bent at the bending area about a bending axis. A first conductive layer extends from the first area to the second area through the bending area and includes a multipath portion having a plurality of through holes. A protection film is disposed over a bottom surface of the substrate. The protection film includes a first protection film base disposed over the bottom surface of the substrate and corresponds to at least a part of the first area. A first adhesive layer is disposed between the substrate and the first protection film base. A first end of the multipath portion facing a center of the first area is disposed farther from a center of the bending area than an end of the first protection film base facing the center of the bending area.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
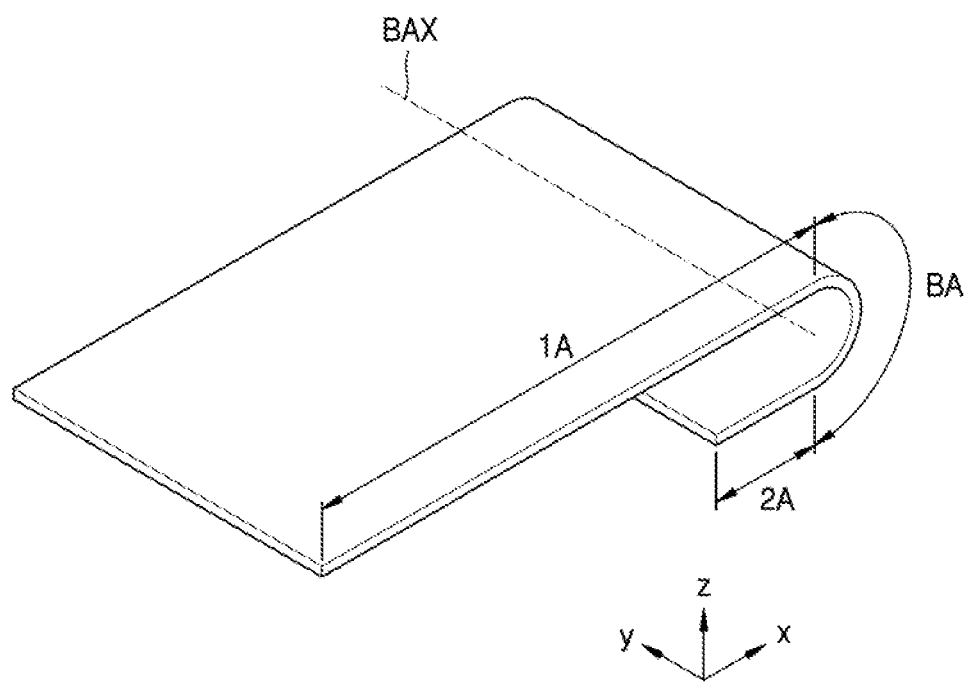
FIG. 1 is a perspective view illustrating a part of a display apparatus, according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the figures and specification, like reference numerals may refer to like elements.

It will be understood that when a layer, region, or component is referred to as being "formed on," another layer, region, or component, it can be directly or indirectly formed on the other layer, region, or component. For example, intervening layers, regions, or components may be present.

Sizes of elements in the drawings may be exaggerated for convenience of explanation.

Figure 2:
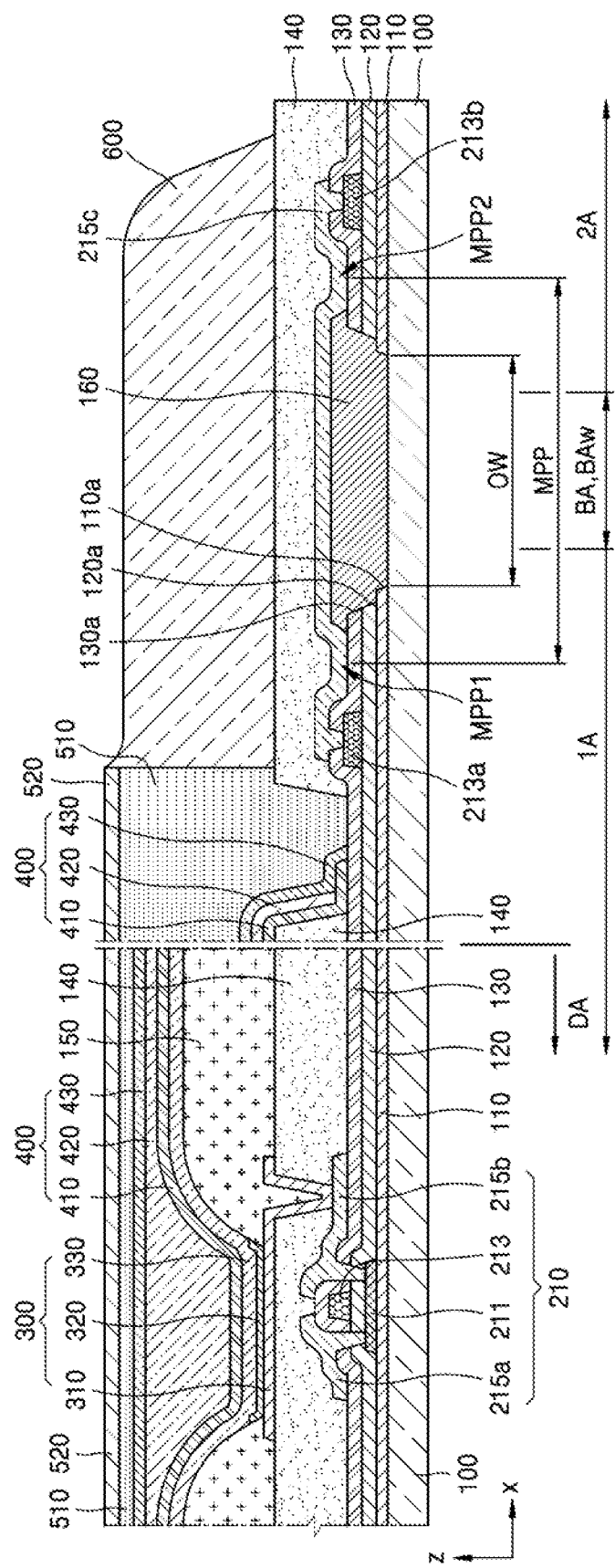
FIG. 2 is a cross-sectional view illustrating a part of the display apparatus shown in FIG. 1.

FIG. 1 is a perspective view illustrating a part of a display apparatus, according to an exemplary embodiment of the present invention, and FIG. 2 is a cross-sectional view illustrating a part of the display apparatus shown in FIG. 1.

As shown in FIGS. 1 and 2, a substrate 100 in the display apparatus, according to an exemplary embodiment of the present invention, includes a bending area BA extending in a first direction (+y direction). The bending area BA is located between a first area 1A and a second area 2A in a second direction (+x direction) crossing the first direction. The substrate 100 is bent about a bending axis BAX (see FIG. 1) extending in the first direction (+y direction). The substrate 100 may include various flexible and/or bendable materials, for example, polymer resins such as polyethersulphone (PES), polyacrylate, polyetherimide (PEI), polyethylene naphthalate (PEN), polyethylene terephthalate (PET), polyphenylene sulfide (PPS), polyarylate (PAR), polyarylate, polyimide (PI), polycarbonate (PC), and/or cellulose acetate propionate (CAP). The substrate 100 may have a multi-layered structure including two layers having one or more of the above polymer resins, as well as a barrier layer including an inorganic material such as silicon oxide, silicon nitride, and/or silicon oxynitride disposed between the two layers.

The first area 1A includes a display area DA. The first area 1A may further include a part of a non-display area that is outside of the display area DA. The second area 2A may also include the non-display area.

In the display area DA of the substrate 100, a thin film transistor (TFT) 210 may be electrically connected to a display device 300. In FIG. 2, an organic light-emitting device is located in the display area DA, as the display device 300. Electric connection of the organic light-emitting device to the TFT 210 may be a pixel electrode 310 being electrically connected to the TFT 210.

The TFT 210 may include a semiconductor layer 211 including amorphous silicon, polycrystalline silicon, and/or an organic semiconductor material. The TFT 210 may also include a gate electrode 213, a source electrode 215a, and a drain electrode 215b. A gate insulating layer 120 may be formed between the semiconductor layer 211 and the gate electrode 213 to provide isolation. The gate insulating layer 120 includes an inorganic material such as silicon oxide, silicon nitride, and/or silicon oxynitride. In addition, an interlayer insulating layer 130 may be disposed on the gate electrode 213. The source electrode 215a and the drain electrode 215b may be disposed on the interlayer insulating layer 130. The interlayer insulating layer 130 may include an inorganic material such as silicon oxide, silicon nitride, and/or silicon oxynitride. The insulating layers including the inorganic material may be formed by chemical vapor deposition (CVD) or atomic layer deposition (ALD).

A buffer layer 110 may be disposed between the TFT 210, having the above-described structure, and the substrate 100. The buffer layer 110 may include an inorganic material such as silicon oxide, silicon nitride, and/or silicon oxynitride. The buffer layer 110 may increase smoothness of the upper surface of the substrate 100, or prevent or reduce infiltration of impurities from the substrate 100 into the semiconductor layer 211 of the TFT 210.

A planarization layer 140 may be disposed on the TFT 210. For example, as shown in FIG. 2, when the organic light-emitting device is disposed on the TFT 210, the planarization layer 140 may planarize an upper portion of the TFT 210. The planarization layer 140 may include, for example, an organic material such as acryl, benzocyclobutene (BCB), and/or hexamethyldisiloxane (HMDSO). In FIG. 2, although the planarization layer 140 is illustrated as having a single-layered structure, the planarization layer 140 may be variously modified. For example, the planarization layer 140 may have a multi-layered structure. In addition, as shown in FIG. 2, the planarization layer 140 may have an opening that is outside of the display area DA, so that a part of the planarization layer 140 in the display area DA and a part of the planarization layer 140 in the second area 2A may be separated from each other. Thus, impurities from the outside might not reach the display area DA via the planarization layer 140.

In the display area DA of the substrate 100, the display device 300 may be disposed on the planarization layer 140. The display device 300 may be an organic light-emitting device including the pixel electrode 310, a counter electrode 330, and an intermediate layer 320 disposed between the pixel electrode 310 and the counter electrode 330. The intermediate layer 320 may include an emission layer. The pixel electrode 310 may contact either the source electrode 215a or the drain electrode 215b via an opening formed in the planarization layer 140 and may be electrically connected to the TFT 210, as shown in FIG. 2.

A pixel-defining layer 150 may be disposed on the planarization layer 140. The pixel-defining layer 150 includes an opening corresponding to each sub-pixel. Each opening may expose at least a center portion of the pixel electrode 310, to define a pixel. Also, in the example shown in FIG. 2, the pixel-defining layer 150 increases a distance between an edge of the pixel electrode 310 and the counter electrode 330 above the pixel electrode 310 so as to prevent arcing at the edge of the pixel electrode 310. The pixel-defining layer 150 may include an organic material, for example, PI or HMDSO.

The intermediate layer 320 of the organic light-emitting device may include low-molecular weight organic materials and/or polymer materials. When the intermediate layer 320 includes a low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure. The low-molecular weight organic materials may be deposited by a vacuum deposition method. When the intermediate layer 320 includes a polymer material, the intermediate layer 320 may include an HTL and an EML. Here, the HTL may include poly(3,4-ethylenedioxythiophene (PEDOT), and the EML may include a poly-phenylenevinylene (PPV)-based or polyfluorene-based polymer material. The intermediate layer 320 described above may be formed by a screen printing method, an inkjet printing method, or a laser induced thermal imaging (LITI) method. However, the intermediate layer 320 is not limited to the above example, and may have various structures. In addition, the intermediate layer 320 may include a layer that is integrally formed across a plurality of the pixel electrodes 310, or a layer that is patterned to correspond to each of the plurality of pixel electrodes 310.

The counter electrode 330 is arranged above the display area DA, and, as shown in FIG. 2, may cover the display area DA. For example, the counter electrode 330 may be integrally formed with respect to a plurality of organic light-emitting devices, so as to correspond to a plurality of the pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the counter electrode 330, and may include silicon oxide, silicon nitride, and/or silicon oxynitride. If desired, other layers such as a capping layer may be disposed between the first inorganic encapsulation layer 410 and the counter electrode 330. Since the first inorganic encapsulation layer 410 is shaped according to its underlying structures, the first inorganic encapsulation layer 410 may have an uneven upper surface. The organic encapsulation layer 420 covers the first inorganic encapsulation layer 410, and unlike the first inorganic encapsulation layer 410, the organic encapsulation layer 420 may have an even or substantially flat upper surface. For example, a portion of the organic encapsulation layer 420 corresponding to the display area DA may have a substantially even upper surface. The organic encapsulation layer 420 may include PET, PEN, PC, PI, polyethylene sulfonate, polyoxymethylene, polyarylate, and/or hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact an edge of the first inorganic encapsulation layer 410 outside the display area DA, to protect the organic encapsulation layer 420 from exposure.

As described above, since the encapsulation layer 400 includes the first inorganic encapsulation layer 410, the organic encapsulation layer 420, and the second inorganic encapsulation layer 430, even if there is a crack in the encapsulation layer 400 in the above-described multi-layered structure, the crack may be disconnected between the first inorganic encapsulation layer 410 and the organic encapsulation layer 420 or between the organic encapsulation layer 420 and the second inorganic encapsulation layer 430. As such, the likelihood of forming a path through which external moisture or oxygen may infiltrate into the display area DA may be reduced.

A polarization plate 520 may be attached on the encapsulation layer 400 via an optically clear adhesive (OCA) 510. The polarization plate 520 may reduce reflection of external light. For example, when external light that passes through the polarization plate 520 is reflected by an upper surface of the counter electrode 330 and then the reflected light passes through the polarization plate 520 again, the external light passes through the polarization plate 520 twice and thus a phase of the external light may be changed. Therefore, a phase of reflected light is different from the phase of the external light entering the polarization plate 520 and thus destructive interference occurs. Accordingly, reflection of external light may be reduced and visibility may be increased. The OCA 510 and the polarization plate 520 may cover an opening in the planarization layer 140, as shown in FIG. 2. The display apparatus, according to one or more exemplary embodiments of the present invention, might not necessarily include the polarization plate 520, and if desired, the polarization plate 520 may be omitted or replaced by other elements. For example, the polarization plate 520 may be omitted, and a black matrix and a color filter may be used to reduce reflection of external light.

In addition, the buffer layer 110, the gate insulating layer 120, and the interlayer insulating layer 130, including the inorganic material, may be collectively referred to as an inorganic insulating layer. The inorganic insulating layer may include an opening corresponding to the bending area BA, as shown in FIG. 2. For example, the buffer layer 110, the gate insulating layer 120, and the interlayer insulating layer 130 may respectively include openings 110a, 120a, and 130a corresponding to the bending area BA. The openings may overlap the bending area BA. An area of the opening may be greater than that of the bending area BA. In this regard, in FIG. 2, a width OW of the opening is greater than a width BAw of the bending area BA. For reference, the width OW of the opening or the width Baw of the bending area BA in FIG. 2 may be shown enlarged or reduced for convenience of illustration. Here, the area of the opening may be defined as the smallest area among areas of the openings 110a, 120a, and 130a, the gate insulating layer 120, and the interlayer insulating layer 130. In FIG. 2, the area of the opening is defined by an area of the opening 110a in the buffer layer 110.

After forming the opening 110a in the buffer layer 110, the opening 120a of the gate insulating layer 120 and the opening 130a of the interlayer insulating layer 130 may be simultaneously formed. When the TFT 210 is formed, in order for the source electrode 215a and the drain electrode 215b to contact the semiconductor layer 211, contact holes penetrating through the gate insulating layer 120 and the interlayer insulating layer 130 have to be formed. Thus, the opening 120a of the gate insulating layer 120 and the opening 130a of the interlayer insulating layer 130 may be simultaneously formed when forming the contact holes. Accordingly, an internal surface of the opening 120a of the gate insulating layer 120 and an internal surface of the opening 130a of the interlayer insulating layer 130 may form a single continuous surface as shown in FIG. 2.

The display apparatus, according to exemplary embodiments of the present invention, includes an organic material layer 160 at least partially filling the opening of the inorganic insulating layer. In FIG. 2, the organic material layer 160 is shown as completely filling the opening. In addition, the display apparatus, according to exemplary embodiments of the present invention, includes a first conductive layer 215c, and the first conductive layer 215c extends from the first area 1A to the second area 2A across the bending area BA and above the organic material layer 160. The first conductive layer 215c may also extend over an inorganic insulating layer such as the interlayer insulating layer 130, where the organic material layer 160 is not provided. The first conductive layer 215c may be formed simultaneously with the source electrode 215a or the drain electrode 215b by using the same material as that of the source electrode 215a or the drain electrode 215b.

As described above, although FIG. 2 shows a state in which the display apparatus is not bent, this depiction is merely for convenience of description, the display apparatus, according to exemplary embodiments of the present invention, may also be in a state in which the substrate 100 is bent at the bending area BA, as shown in FIG. 1. In this regard, the display apparatus is manufactured so that the substrate 100 is flat, as shown in FIG. 2, and after that, the substrate 100 is bent at the bending area BA so that the display apparatus may have the shape as shown in FIG. 1. When the substrate 100 is bent at the bending area BA, tensile stress may be induced in the first conductive layer 215c. However, in the display apparatus, according to exemplary embodiments of the present invention, the occurrence of defects in the first conductive layer 215c during the bending process may be prevented or reduced.

If the inorganic insulating layers such as the buffer layer 110, the gate insulating layer 120, and/or the interlayer insulating layer 130 do not include openings corresponding to the bending area BA, but continuously extend from the first area 1A to the second area 2A, and if the first conductive layer 215c is on an inorganic insulating layer, large tensile stress is applied to the first conductive layer 215c during bending of the substrate 100. For example, because the hardness of the inorganic insulating layer is greater than that of the organic material layer, cracks are likely to form in the inorganic insulating layer in the bending area BA, and when a crack occurs in the inorganic insulating layer, a crack may also occur in the first conductive layer 215c on the inorganic insulating layer and thus the probability of generating defects such as disconnection in the first conductive layer 215c increases greatly.

However, in the display apparatus of an exemplary embodiment of the present invention, the inorganic insulating layer includes the opening corresponding to the bending area BA, and the part of the first conductive layer 215c which corresponds to the bending area BA is on the organic material layer 160 that at least partially fills the opening. Since the inorganic insulating layer includes the opening corresponding to the bending area BA, the possibility of cracks occurring in the inorganic insulating layer is greatly decreased, and the organic material layer 160 is less likely to crack due to characteristics of the organic material. Therefore, the occurrence of cracks in the portion of the first conductive layer 215c on the organic material layer 160 may be prevented or reduced, where the portion of the first conductive layer 215c corresponds to the bending area BA. Since the hardness of the organic material layer 160 is less than that of an inorganic material layer, the organic material layer 160 may absorb the tensile stress generated due to the bending of the substrate 100 so as to reduce the concentration of the tensile stress in the first conductive layer 215c.

In FIG. 2, the inorganic insulating layer is shown as having the opening, but the present invention is not limited to this particular arrangement. For example, the inorganic insulating layer may have a groove instead of the opening. For example, the buffer layer 110 might not include the opening 110a, unlike the example shown in FIG. 2, but may instead extend continuously from the first area 1A to the second area 2A across the bending area BA. Then, only the gate insulating layer 120 and the interlayer insulating layer 130 may include the openings 120a and 130a. In this case, the buffer layer 110, the gate insulating layer 120, and the interlayer insulating layer 130, which include the inorganic material, may be collectively referred to as an inorganic insulating layer, and in this case, the inorganic insulating layer may be understood to have the groove corresponding to the bending area BA. In addition, the organic material layer 160 may at least partially fill the groove.

In the above case, since the inorganic insulating layer has the groove corresponding to the bending area BA, a thickness of the inorganic insulating layer is reduced in the bending area BA, and accordingly, the substrate 100 may be more easily bent. In addition, since the organic material layer 160 is in the bending area BA and the first conductive layer 215c is above the organic material layer 160, damage to the first conductive layer 215c during the bending operation may be effectively prevented. An example in which the inorganic insulating layer includes the opening is described above and below. Modified examples of this arrangement are also described. However, it is to be understood that these examples are offered for convenience of description, and that the inorganic insulating layer may instead include the groove as described above.

The display apparatus, according to exemplary embodiments of the present invention, may include second conductive layers 213a and 213b, in addition to the first conductive layer 215c. The second conductive layers 213a and 213b are located above the first area 1A or the second area 2A at a different layer from that of the first conductive layer 215c, and may be electrically connected to the first conductive layer 215c. In FIG. 2, the second conductive layers 213a and 213b are at the same layer on the gate insulating layer 120, and include the same material as that of the gate electrode 213. In addition, the first conductive layer 215c contacts the second conductive layers 213a and 213b via contact holes in the interlayer insulating layer 130. In addition, the second conductive layer 213a is in the first area 1A, and the second conductive layer 213b is in the second area 2A.

The second conductive layer 213a in the first area 1A may be electrically connected to the TFT 210 in the display area DA, and accordingly, the first conductive layer 215c may be electrically connected to the TFT 210 in the display area DA via the second conductive layer 213a. The second conductive layer 213b in the second area 2A may also be electrically connected to the TFT 210 of the display area DA, for example, via the first conductive layer 215c. As such, the second conductive layers 213a and 213b that are outside of the display area DA may be electrically connected to the elements in the display area DA. Alternatively, the second conductive layers 213a and 213b may extend toward the display area DA so that at least some parts of the second conductive layers 213a and 213b may be located within the display area DA.

As described above, although FIG. 2 shows a state in which the display apparatus is not bent for convenience of description, the display apparatus, according to exemplary embodiments of the present invention, may also be in a state in which the substrate 100 is bent at the bending area BA, as shown in FIG. 1. In this regard, the display apparatus is manufactured so that the substrate 100 is flat, as shown in FIG. 2, and after that, the substrate 100 is bent at the bending area BA so that the display apparatus may have the shape as shown in FIG. 1. Here, while the substrate 100 is bent at the bending area BA, tensile stress may be applied to the elements in the bending area BA.

Therefore, the first conductive layer 215c crossing over the bending area BA includes a material having a high ductility, so that defects such as cracks in the first conductive layer 215c or disconnection of the first conductive layer 215c may be prevented. In addition, the second conductive layers 213a and 213b, including a material having ductility that is lower than that of the first conductive layer 215c and electrical/physical characteristics that are different from those of the first conductive layer 215c, are formed in the first area 1A or the second area 2A, and thus, an efficiency of transferring electric signals in the display apparatus may be increased or a defect rate during the manufacturing processes of the display apparatus may be reduced.

For example, the second conductive layers 213a and 213b may include molybdenum, and the first conductive layer 215c may include aluminum. The first conductive layer 215c and the second conductive layers 213a and 213b may have multi-layered structures, where desired. For example, the first conductive layer 215c may have a multi-layered structure such as a titanium layer/aluminum layer/titanium layer structure, and the second conductive layers 213a and 213b may each have a multi-layered structure such as a molybdenum layer/titanium layer structure. However, the present invention is not limited to this particular configuration. For example, the first conductive layer 215c may extend to the display area DA and be electrically connected directly to the source electrode 215a, the drain electrode 215b, or the gate electrode 213 of the TFT 210.

In addition, as shown in FIG. 2, the organic material layer 160 may cover an internal surface of the opening of the inorganic insulating layer. As described above, since the first conductive layer 215c may include the same material as, and may be formed simultaneously with, the source electrode 215a and the drain electrode 215b, a conductive layer may be formed on the interlayer insulating layer 130 over an entire surface of the substrate 100 and may be patterned to form the source electrode 215a, the drain electrode 215b, and the first conductive layer 215c. If the organic material layer 160 does not cover the internal surfaces of the opening 110a in the buffer layer 110, the opening 120a in the gate insulating layer 120, or the opening 130a in the interlayer insulating layer 130, the conductive material of the conductive layer might not be removed from, but may remain on, these internal surfaces. In this case, the remaining conductive material may cause shorts between different conductive layers. Therefore, when the organic material layer 160 is formed, the organic material layer 160 may cover the internal surface of the opening in the inorganic insulating layer.

In addition, a bending protection layer (BPL) 600 may be located outside the display area DA. For example, the BPL 600 may be located above the first conductive layer 215c, corresponding at least to the bending area BA.

When a stack structure is bent, there is a stress neutral plane in the stack structure. If there is no BPL 600 when the substrate 100 is bent, excessive tensile stress may be applied to the first conductive layer 215c in the bending area BA, because the location of the first conductive layer 215c might not correspond to a stress neutral plane. However, by forming the BPL 600 and adjusting a thickness and a modulus of the BPL 600, a location of the stress neutral plane in the structure including the substrate 100, the first conductive layer 215c, and the BPL 600 may be adjusted. Therefore, the stress neutral plane may be adjusted to be proximate to the first conductive layer 215c via the BPL 600, and thus, the tensile stress applied to the first conductive layer 215c may be reduced or compressive stress may be applied to the first conductive layer 215c. The BPL 600 may include acryl. When compressive stress is applied to the first conductive layer 215c, the risk of damaging the first conductive layer 215c is less than when tensile stress is applied to the first conductive layer 215c.

In FIG. 2, an edge surface of the BPL 600 facing an edge of the substrate 100 (+y direction) does not coincide with an edge surface of the substrate 100, but is located close to the edge surface of the substrate 100. However, the present invention is not limited to this particular configuration. For example, the edge surface of the BPL 600 may correspond to the edge surface of the substrate 100. For example, when a plurality of display units is formed on a mother substrate and then the mother substrate is cut to simultaneously manufacture a plurality of display apparatuses, the BPL 600 may be formed before the cutting process. In this case, the BPL 600 is also cut when the mother substrate is cut, and accordingly, the edge surface of the BPL 600 may correspond to the edge surface of the substrate 100. The cutting may be performed by a laser beam directed to the mother substrate.

In addition, in FIG. 2, an upper surface of the BPL 600 in a direction towards the display area DA (-x direction) corresponds to an upper surface of the polarization plate 520 (in the +z direction), but the invention is not limited to this arrangement. For example, an end of the BPL 600 in the direction towards the display area DA (-x direction) may partially cover an upper surface at the edge of the polarization plate 520. Alternatively, the end of the BPL 600 in the direction towards the display area DA (-x direction) might not contact the polarization plate 520 and/or the OCA 510. In the latter case, during or after forming the BPL 600, gas that is generated from the BPL 600 may be prevented from moving in a direction toward the display area DA (-x direction), which would risk degrading the display device 300.

As shown in FIG. 2, if the upper surface of the BPL 600 in a direction towards the display area DA (-x direction) coincides with the upper surface of the polarization plate 520 in the +z direction, if the end of the BPL 600 in the display area DA direction (-x direction) partially covers the upper surface at the end of the polarization plate 520, or if the end of the BPL 600 in the display area DA direction (-x direction) contacts the OCA 510, a thickness of the BPL 600 corresponding to the display area DA (-x direction) may be greater than that of the other portions in the BPL 600. Since a liquid phase material or a paste-type material may be applied and hardened to form the BPL 600, the volume of the BPL 600 may be reduced through the hardening process. Here, if the portion of the BPL 600 corresponding to the display area DA (-x direction) is in contact with the polarization plate 520 and/or the OCA 510, the portion of the BPL 600 is fixed at the location, and thus, the volume reduction occurs in the remaining portion of the BPL 600. Therefore, the thickness of the BPL 600 corresponding or proximate to the display area DA (-x direction) may be greater than that of the rest of the BPL 600.

Figure 3:
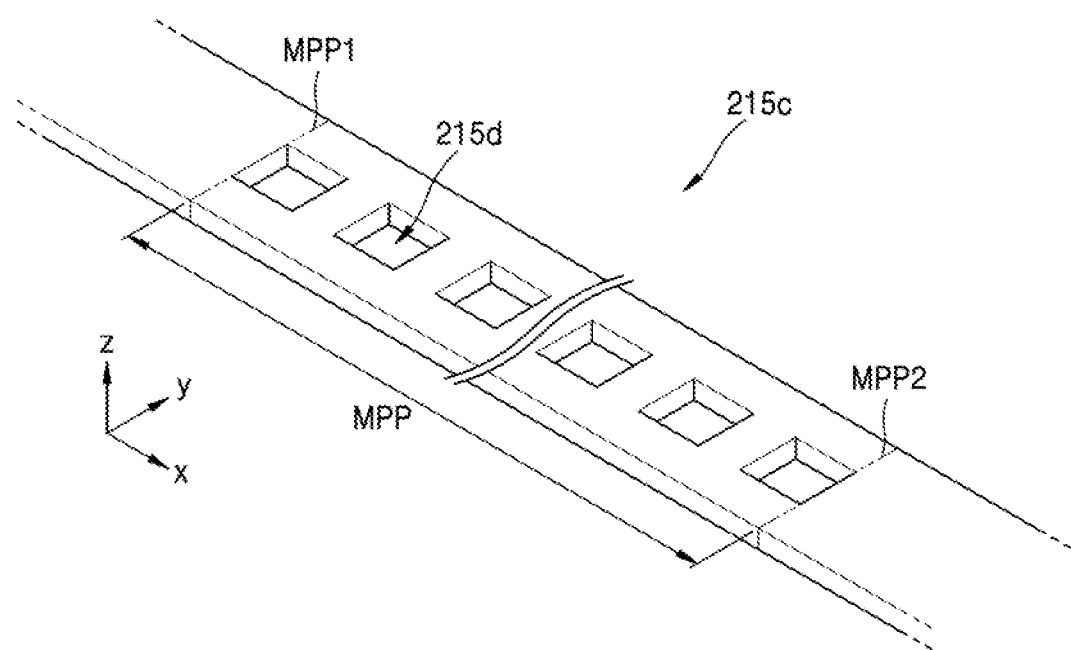
FIG. 3 is a perspective view illustrating a part of the display apparatus shown in FIG. 1.

The first conductive layer 215c may extend from the first area 1A to the second area 2A through the bending area BA. As shown in FIG. 3 (a perspective view of a part of the display apparatus of FIG. 1), the first conductive layer 215c includes a multipath portion MPP including a plurality of through holes 215d. Although the display apparatus is not bent, e.g., the first conductive layer 215c is not bent in FIG. 3, the substrate 100 and the first conductive layer 215c of the display apparatus may be bent at the bending area BA as shown in FIG. 1. Also, in FIG. 3, a first end MPP1 of the multipath portion MPP toward the display area DA and a second end MPP2 of the multipath portion MPP away from the display area DA are shown by alternate long and two short dashes lines that indicate locations of the first and second ends MPP1 and MPP2. The first conductive layer 215c may have a continuous shape before or after the first end MPP1, or before or after the second end MPP2.

As such, when the first conductive layer 215c has the plurality of through holes 215d, damage to the first conductive layer 215c due to bending may be effectively prevented or reduced. When the first conductive layer 215c has the plurality of through holes 215d, flexibility of the first conductive layer 215c increases, and accordingly, even when tensile stress is generated via bending, a defect, such as disconnection at the first conductive layer 215c, may be effectively prevented. In this regard, the first conductive layer 215c may include the plurality of through holes 215d at a region corresponding to at least the bending area BA. For example, the multipath portion MPP of the first conductive layer 215c may correspond to the bending area BA.

In FIG. 2, the plurality of through holes 215d are not shown in the first conductive layer 215c for convenience of illustration. Alternatively, it may be understood that FIG. 2 illustrates only a part of the first conductive layer 215c where the plurality of through holes 215d are not located.

As described above, the display apparatus and the first conductive layer 215c that is a part of the display apparatus are not bent in FIGS. 2 and 3 for convenience, but in the display apparatus, according to exemplary embodiments of the present invention, the substrate 100 and the first conductive layer 215c are bent at the bending area BA as shown in FIG. 1. In this regard, during manufacture, the display apparatus is manufactured such that the substrate 100 is roughly flat as shown in FIG. 2, and then the substrate 100 is bent at the bending area BA such that the display apparatus has a shape shown in FIG. 1. At this time, in order to reduce the risk of the first conductive layer 215c being damaged while the substrate 100 or the like is bent at the bending area BA, the multipath portion MPP may overlap the bending area BA.

In addition, direct stress due to bending is not applied to a part of the first conductive layer 215c not overlapping the bending area BA, but indirect stress may be applied thereto when stress generated in a part of the first conductive layer 215c overlapping the bending area BA is transferred along the first conductive layer 215c. In order to prevent the first conductive layer 215c from being damaged by the indirect stress, the multipath portion MPP of the first conductive layer 215c, which is less susceptible to damage caused by stress, may correspond up to an area in addition to the bending area BA. For example, at least one of the first end MPP1 of the multipath portion MPP facing the center of the first area 1A and the second end MPP2 of the multipath portion MPP in a direction from the first area 1A to the second area 2A may be disposed over the inorganic insulating layer. In FIG. 2, the first and second ends MPP1 and MPP2 of the multipath portion MPP may both be over the interlayer insulating layer 130. Here, it may be understood that the length of the multipath portion MPP, in a direction from the first area 1A to the second area 2A, is greater than the width OW of the opening or groove in a direction from the first area 1A to the second area 2A.

As such, when the multipath portion MPP extends up to the inorganic insulating layer, the first conductive layer 215c may be strong and may not be damaged due to bending. For example, the part of the first conductive layer 215c, to which direct stress is applied due to bending, may include the multipath portion MPP to prevent a situation in which electric signal transmission is impossible due to damage caused by stress, and the part of the first conductive layer 215c, to which indirect stress is applied due to bending, may also include the multipath portion MPP to reduce defects of the first conductive layer 215c.

Although in FIG. 2 both the first and second ends MPP1 and MPP2 of the multipath portion MPP are disposed over the interlayer insulating layer 130, the invention is not limited to this particular arrangement. For example, at least one of the first end MPP1 of the multipath portion MPP facing the center of the first area 1A and the second end MPP2 of the multipath portion MPP in the direction from the first area 1A to the second area 2A may be disposed over the inorganic insulating layer. Accordingly, a defect rate of the first conductive layer 215c may be reduced.

Meanwhile, as shown in FIG. 3, the plurality of through holes 215d of the first conductive layer 215c may be arranged in a row along the extension direction of the first conductive layer 215c. Here, since the display apparatus, according to the exemplary embodiment shown in FIG. 1, has a bending shape at the bending area BA, the first conductive layer 215c also has a bending shape at the bending area BA. Accordingly, the extension direction of the first conductive layer 215c is a direction in which the first conductive layer 215c extends while the first conductive layer 215c is bent at the bending area BA. For example, the extension direction of the first conductive layer 215c may be a direction of a curved shape instead of a linear shape.

Figure 4:
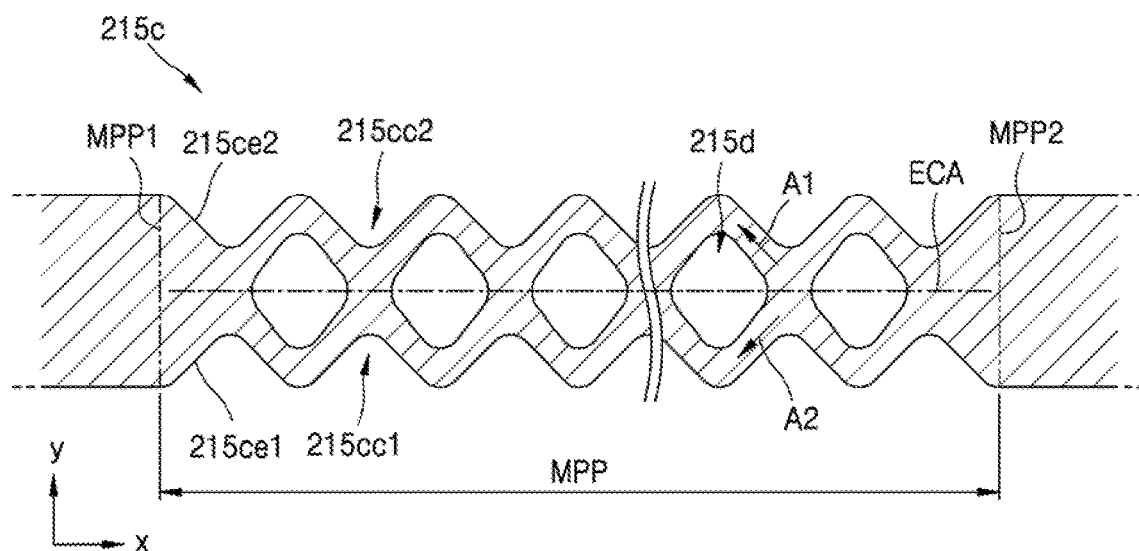
FIG. 4 is a plan view illustrating a part of a display apparatus, according to an exemplary embodiment of the present invention.

Here, as shown in FIG. 3, the edge of the first conductive layer 215c may have a linear shape before the first conductive layer 215c is bent. However, as shown in FIG. 4, which is a plan view of a part of the display apparatus, according to an exemplary embodiment of the present invention, a first edge 215ce1 of the first conductive layer 215c, which is at one side of an extension center axis ECA of the first conductive layer 215c (−y direction), includes first concave portions 215cc1 that correspond to spaces between the plurality of through holes 215d. In addition, a second edge 215ce2 of the first conductive layer 215c, which is at the other side of the extension center axis ECA (+y direction), includes second concave portions 215cc2 corresponding to the spaces between the plurality of through holes 215d. For example, the first concave portions 215cc1 and the second concave portions 215cc2 may be in one-to-one correspondence, as shown in FIG. 4.

It may be understood that FIG. 4 shows the first conductive layer 215c before the substrate 100 and the first conductive layer 215c are bent during manufacture. The same is applied to embodiments described below.

In the display apparatus, according to an exemplary embodiment of the present invention, the extension direction of the edge defining the through hole 215d of the first conductive layer 215c forms a non-zero angle with the overall extension direction (+x direction) of the first conductive layer 215c, as denoted by arrows A1 and A2 of FIG. 4. The bending axis BAX (see FIG. 1) when the substrate 100 is bent at the bending area BA is substantially perpendicular to the extension center axis ECA of the conductive layer 215c. Accordingly, large tensile stress is applied to the region of the first conductive layer 215c extending towards the extension center axis ECA of the first conductive layer 215c, e.g., to the region of the first conductive layer 215c extending in the overall extension direction (+x direction) of the first conductive layer 215c in FIG. 4. In the display apparatus, according to an exemplary embodiment of the present invention, a direction in which most local regions of the first conductive layer 215c extend forms a non-zero angle with the overall extension direction (+x direction) of the first conductive layer 215c. Accordingly, generation of cracks or disconnection in the first conductive layer 215c may be prevented or reduced.

Figure 5:
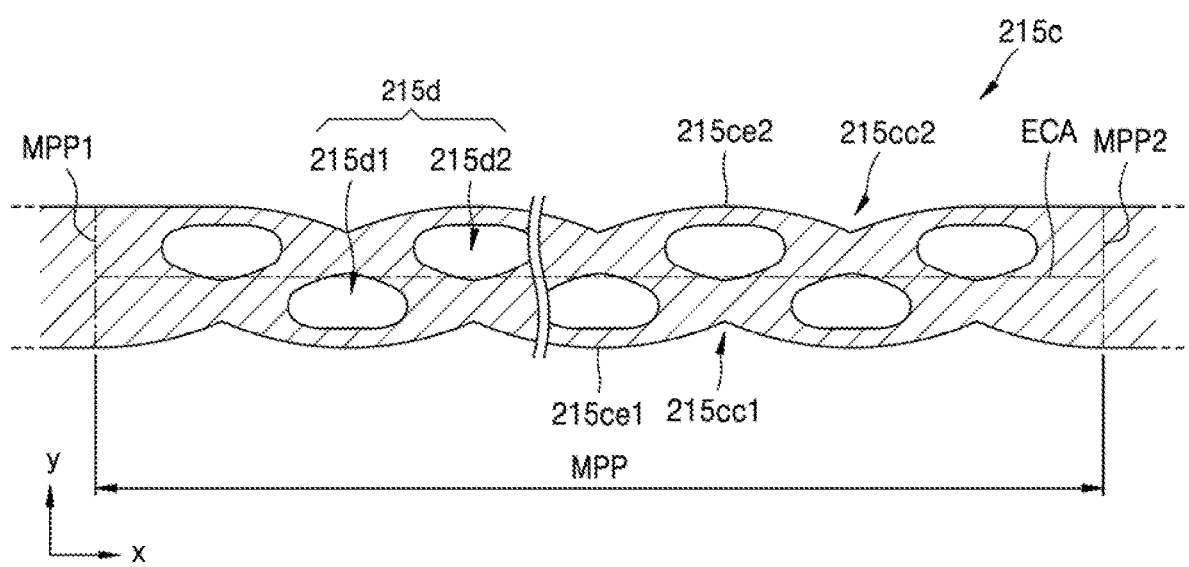
FIG. 5 is a plan view illustrating a part of a display apparatus, according to an exemplary embodiment of the present invention.

In addition, as shown in FIG. 5, which is a plan view of a part of the display apparatus (before being bent), according to an exemplary embodiment of the present invention, in the first conductive layer 215c, the plurality of through holes 215d are arranged along the extension direction (+x direction) of the first conductive layer 215c, and may include a plurality of first through holes 215d1 having centers at a side of the extension center axis ECA (−y direction), and a plurality of second through holes 215d2 having centers at the other side of the extension center axis ECA (+y direction). Here, the plurality of first through holes 215di and the plurality of second through holes 215d2 alternate along the extension direction of the first conductive layer 215c (+x direction). In addition, the first edge 215ce1 of the first conductive layer 215c at a side of the extension center axis ECA (−y direction) includes the first concave portions 215cc1 corresponding to the plurality of second through holes 215d2, and the second edge 215ce2 of the first conductive layer 215c at the other side of the extension center axis ECA (−y direction) includes the second concave portions 215cc2 corresponding to the plurality of first through holes 215dl.

Although in the above described embodiments, the plurality of through holes 215d have substantially rectangular cross-sectional shapes in FIGS. 3 and 4, the invention is not limited to this particular arrangement. For example, the plurality of through holes 215d may have various other cross-sectional shapes, e.g., circles, rhombuses, chamfered rectangles, chamfered rhombuses, ovals, or dented circles.

Figure 6:
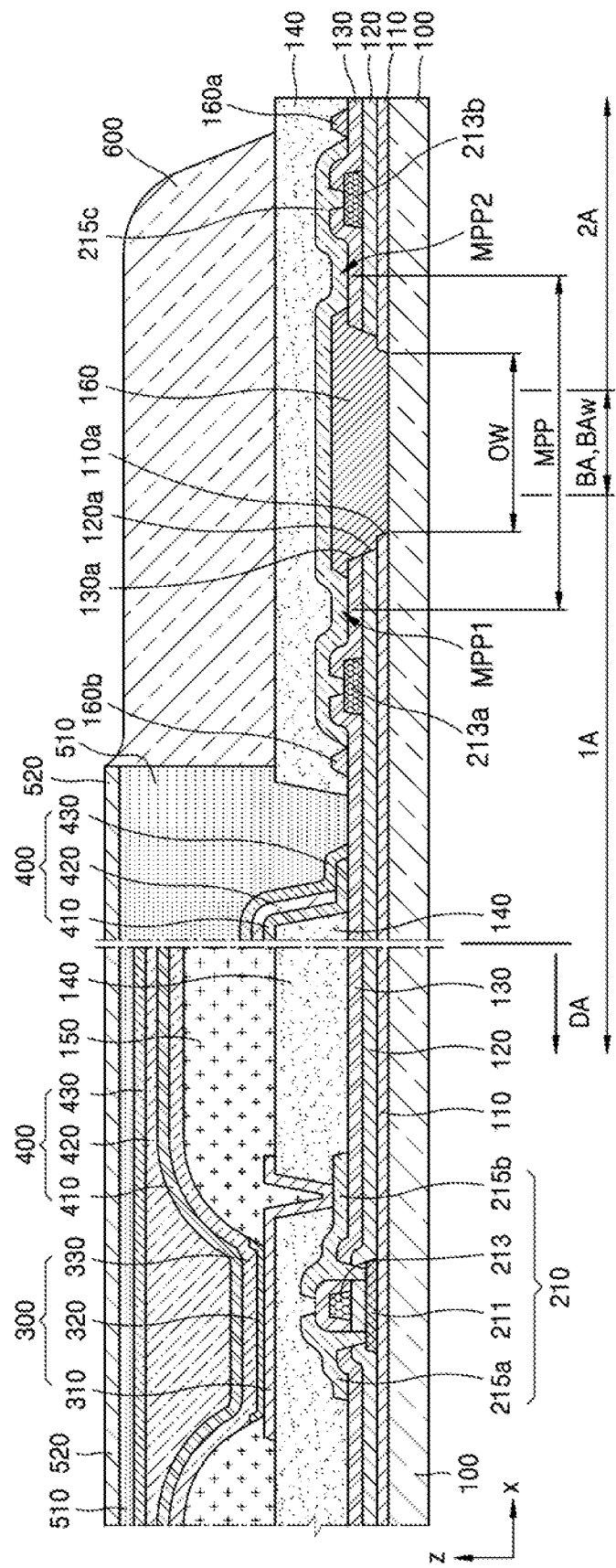
FIG. 6 is a cross-sectional view illustrating a part of a display apparatus, according to an exemplary embodiment of the present invention.

In FIG. 2, the organic material layer 160 only fills the opening of the inorganic insulating layer, but the present invention is not limited to this particular arrangement. For example, as shown in FIG. 6, which is a cross-sectional view of a part of the display apparatus, according to an exemplary embodiment of the present invention, additional organic material layers 160a and 160b, which may include the same material as the organic material layer 160 and may be simultaneously formed when the organic material layer 160 is formed, may be disposed outside the opening of the inorganic insulating layer. In FIG. 6, the additional organic material layers 160a and 160b are disposed over the interlayer insulating layer 130. Here, the additional organic material layer 160a may be disposed at the edge of the substrate 100 instead of at the bending area BA, based on a point where the first and second conductive layers 215c and 213b contact each other, and the additional organic material layer 160b may be disposed at the center of the display area DA instead of at the bending area BA based on a point where the first and second conductive layers 215c and 213a contact each other.

Although in FIG. 6 the additional organic material layers 160a and 160b are spaced apart from the organic material layer 160, in a cross-sectional view at a location different from that of FIG. 6, the additional organic material layers 160a and 160b may be connected and integrated with the organic material layer 160. In this case, a region where the organic material layer 160 is formed is not limited to the opening of the inorganic insulating layer, but one end of the organic material layer 160 may extend up to the center of the display area DA over the point where the first and second conductive layers 215c and 213a contact each other based on the center of the opening of the inorganic insulating layer, and the other end of the organic material layer 160 may extend up to the edge of the substrate 100 over the point where the first and second conductive layers 215c and 213b contact each other based on the center of the opening of the inorganic insulating layer. For example, the ends of the organic material layer 160 at the first and second conductive layers 213a and 213b based on the organic material layer 160 may be disposed farther from the center of the organic material layer 160 than the points where the first conductive layer 215c contacts the first and second conductive layers 213a and 213b.

Such an organic material layer 160 may prevent defects generated when the first conductive layers 215c adjacent in a y-axis direction are electrically connected to each other. The defects may be generated because a part of a conductive layer is not removed while the first conductive layer 215c is formed by forming the conductive layer and patterning the conductive layer.

Figure 7:
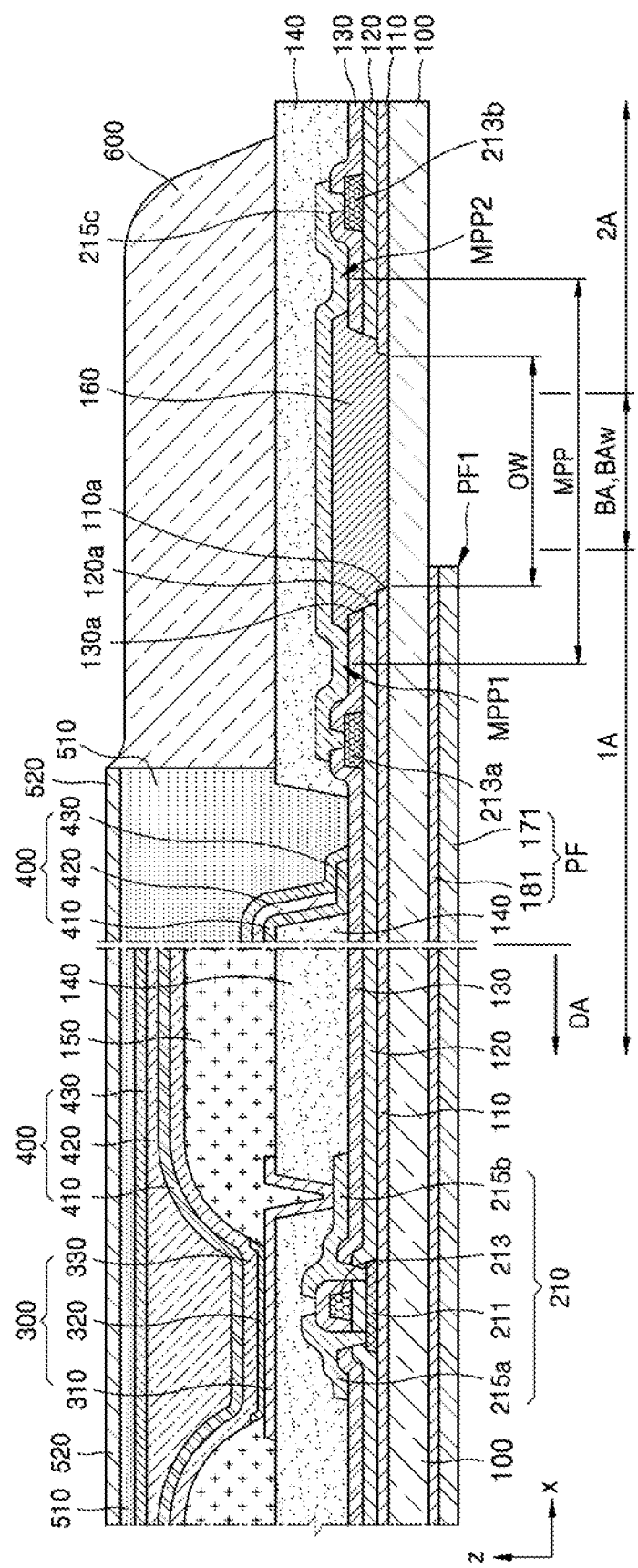
FIG. 7 is a cross-sectional view illustrating a part of a display apparatus, according to an exemplary embodiment of the present invention.

FIG. 7 is a cross-sectional view of a part of a display apparatus, according to an exemplary embodiment of the present invention. The display apparatus may further include a protection film PF disposed on the bottom surface of the substrate 100. The protection film PF is a lower protection film protecting the bottom surface of the substrate 100, and may include PET or PI. The protection film PF may include a first protection film base 171 corresponding to at least a part of the first area 1A, and a first adhesive layer 181, such as a pressure sensitive adhesive (PSA), between the first protection film base 171 and the substrate 100 and adhering the first protection film base 171 to the substrate 100.

The protection film PF may protect the bottom surface of the substrate 100, and may also support the substrate 100. Accordingly, force applied, during manufacture of the display apparatus or in subsequent use, to a region of the substrate 100 where the protection film PF is located and a region of the substrate 100 where the protection film PF is not located may be different. Consequently, stress may be applied to the substrate 100 at a border between the region where the protection film PF is located and the region where the protection film PF is not located, during manufacture of the display apparatus or in subsequent use.

Accordingly, in the first conductive layer 215c, stress is applied to a border between a region corresponding to the first protection film base 171 and a region not corresponding to the first protection film base 171, e.g., to a region of the first conductive layer 215c corresponding to the end of the first protection film base 171, and thus the region may be disconnected. For example, if a region of the first conductive layer 215c corresponding to an end PF1 of the first protection film base 171 facing the center of the bending area BA is not the multipath portion MMP, stress is applied to the region of the first conductive layer 215c corresponding to the end PF1, and thus disconnection may be generated in the region of the first conductive layer 215c.

Accordingly, the first end MPP1 of the multipath portion MPP facing the center of the first area 1A may be disposed farther from the center of the bending area BA than the end PF1 of the first protection film base 171 facing the center of the bending area BA. Accordingly, the portion of the first conductive layer 215c corresponding to the end PF1 of the first protection film base 171 facing the center of the bending area BA may be part of the multipath portion MPP, and thus a situation in which an electric signal is not transmitted due to disconnection of the first conductive layer 215c, may be effectively prevented.

For reference, as shown in FIG. 7, the end PF1 of the first protection film base 171 facing the center of the bending area BA may be disposed between an end of the opening of the inorganic insulating layer facing the center of the display area DA and an end of the bending area BA facing the center of the display area DA. However the present invention is not limited thereto, and the end PF1 of the first protection film base 171 facing the center of the bending area BA may match the end of the opening of the inorganic insulating layer facing the center of the display area DA. Alternatively, the end PF1 of the first protection film base 171 facing the center of the bending area BA might not extend up to the opening of the inorganic insulating layer, but may be located within a portion where the inorganic insulating layer is located.

Figure 8:
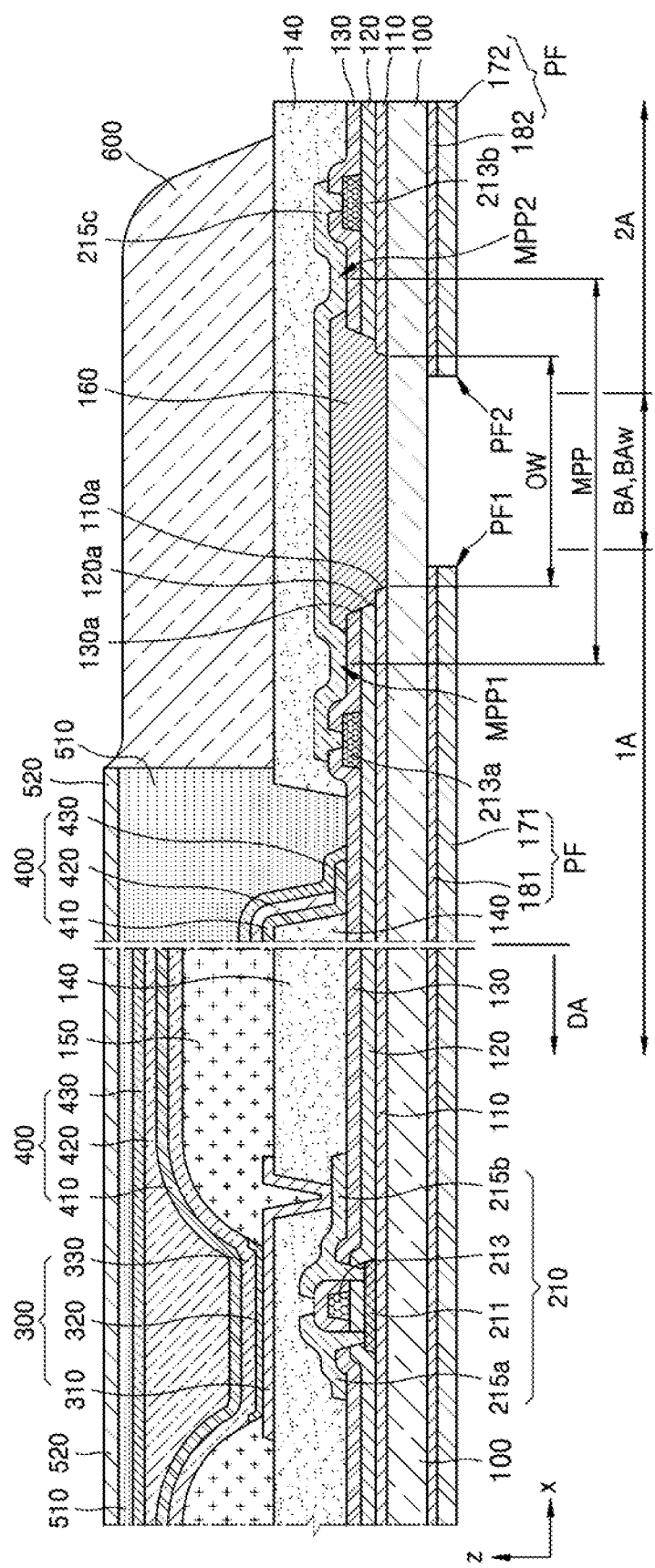
FIG. 8 is a cross-sectional view illustrating a part of a display apparatus, according to an exemplary embodiment of the present invention.

Meanwhile, as shown in FIG. 8, which is a cross-sectional view of a part of the display apparatus, according to an exemplary embodiment of the present invention, the protection film PF may further include a second protection film base 172 spaced apart from the first protection film base 171 disposed over the bottom surface of the substrate 100 and corresponding to at least a part of the second area 2A, and a second adhesive layer 182 disposed between the substrate 100 and the second protection film base 172. For convenience, the substrate 100 is not shown bent in FIG. 8, but the substrate 100 may be bent at the bending area BA such that the first and second protection film bases 171 and 172 face each other.

In such a display apparatus, the second end MPP2 of the multipath portion MPP, in a direction from the first area 1A to the second area 2A, may be disposed farther from the center of the bending area BA than an end PF2 of the second protection film base 172 facing the center of the bending area BA. Accordingly, the portion of the first conductive layer 215c corresponding to the end PF2 of the second protection film base 172 facing the center of the bending area BA may be part of the multipath portion MPP, and thus a situation in which an electric signal is not transmitted due to disconnection of the first conductive layer 215c, may be effectively prevented.

As shown in FIG. 8, the end PF2 of the second protection film base 172 facing the center of the bending area BA may be disposed between an end of the opening of the inorganic insulating layer facing the edge of the substrate 100 and an end of the bending area BA facing the edge of the substrate 100. However, the present invention is not limited thereto, and the end PF2 of the second protection film base 172 facing the center of the bending area BA may match the end of the opening of the inorganic insulating layer facing the edge of the substrate 100. Alternatively, the end PF2 of the second protection film base 172 facing the center of the bending area BA might not extend up to the opening of the inorganic insulating layer, but may be located within a portion where the inorganic insulating layer is located.

Figure 9:
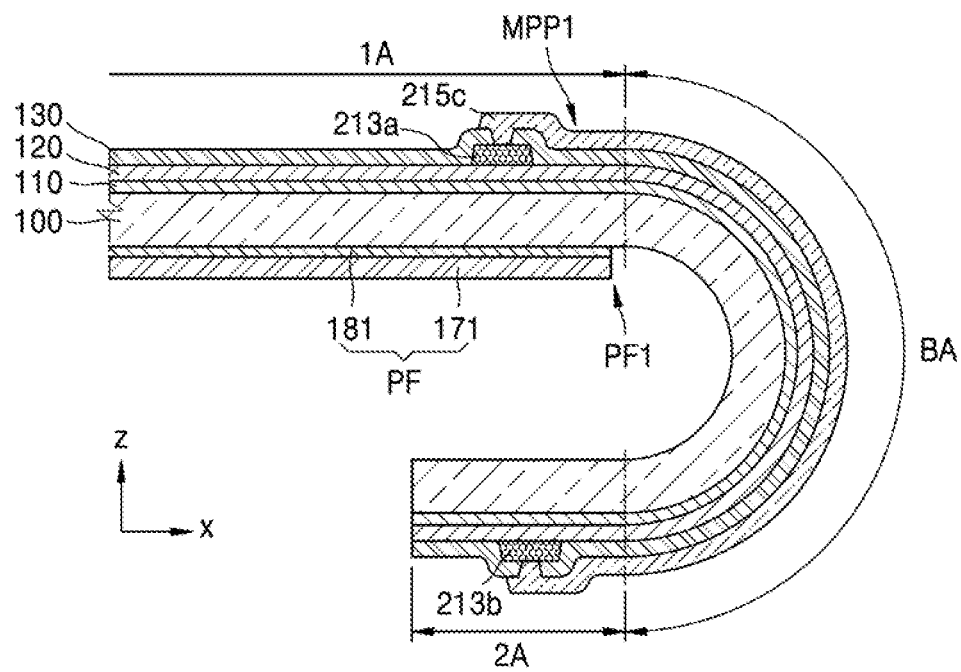
FIG. 9 is a cross-sectional view illustrating a part of a display apparatus, according to an exemplary embodiment of the present invention.

Hereinabove, the inorganic insulating layer of the display apparatus includes an opening or a groove, but the present invention is not limited to this particular arrangement. For example, as shown in FIG. 9, which is a cross-sectional view of a part of the display apparatus, according to an exemplary embodiment of the present invention, the buffer layer 110, the gate insulating layer 120, and the interlayer insulating layer 130 may also be disposed in the bending area BA. In addition to the inorganic insulating layer, other layers may have an opening or a groove.

The display apparatus may include the protection film PF over the bottom surface of the substrate 100. The protection film PF is a lower protection film protecting the bottom surface of the substrate 100, and may include the first protection film base 171 corresponding to at least a part of the first area 1A, and the first adhesive layer 181 disposed between the first protection film base 171 and the substrate 100 to adhere the first protection film base 171 to the substrate 100.

The protection film PF may protect the bottom surface of the substrate 100 and may also support the substrate 100. Accordingly, force applied, both during manufacture of the display apparatus and in subsequent use, to a region of the substrate 100 where the protection film PF is located and a region of the substrate 100 where the protection film PF is not located may be different. Consequently, stress may be applied to the substrate 100 at a border between the region where the protection film PF is located and the region where the protection film PF is not located, during manufacture of the display apparatus or in subsequent use.

Accordingly, in the first conductive layer 215c, stress is applied to a border between a region corresponding to the first protection film base 171 and a region not corresponding to the first protection film base 171, e.g., to a region of the first conductive layer 215c corresponding to the end of the first protection film base 171, and thus the region may be disconnected. For example, if the region of the first conductive layer 215c corresponding to the end PF1 of the first protection film base 171 facing the center of the bending area BA is not the multipath portion MMP, stress is applied to the region of the first conductive layer 215c corresponding to the end PF1, and thus disconnection may be generated in the region of the first conductive layer 215c.

Accordingly, the first end MPP1 of the multipath portion MPP facing the center of the first area 1A may be disposed farther from the center of the bending area BA than the end PF1 of the first protection film base 171 facing the center of the bending area BA. Accordingly, the portion of the first conductive layer 215c corresponding to the end PF1 of the first protection film base 171 facing the center of the bending area BA may be the part of the multipath portion MPP, and thus a situation, in which an electric signal is not transmitted due to disconnection of the first conductive layer 215c, may be effectively prevented.

Figure 10:
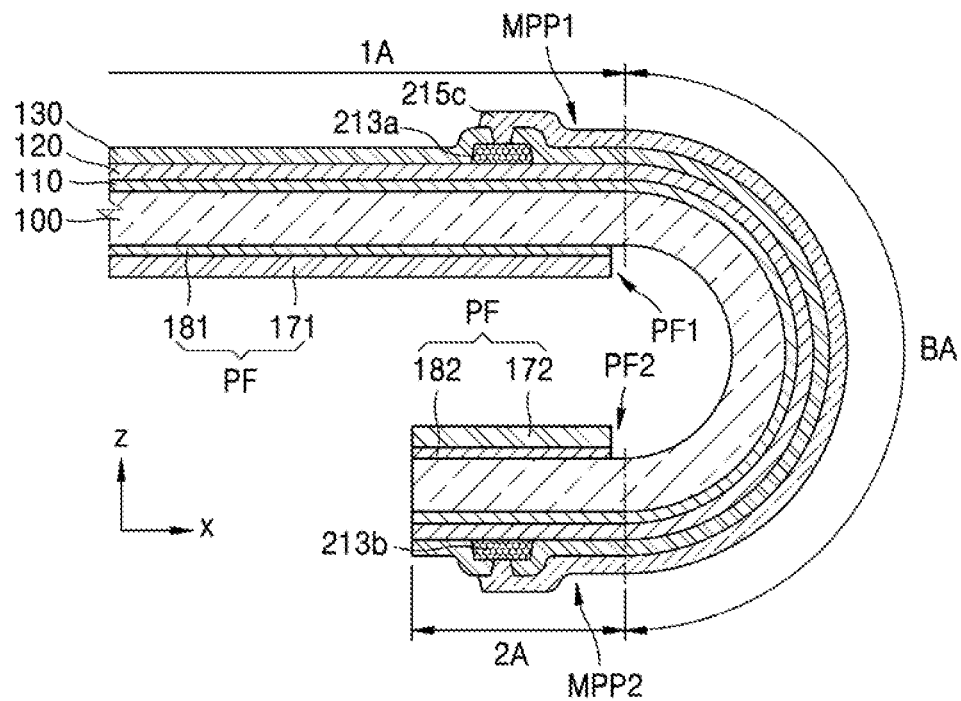
FIG. 10 is a cross-sectional view illustrating a part of a display apparatus, according to an exemplary embodiment of the present invention.

As shown in FIG. 10, which is a cross-sectional view of a part of the display apparatus, according to an exemplary embodiment of the present invention, the protection film PF may further include the second protection film base 172 spaced apart from the first protection film base 171 disposed over the bottom surface of the substrate 100 and corresponding to at least a part of the second area 2A, and the second adhesive layer 182 disposed between the substrate 100 and the second protection film base 172. In FIG. 10, the substrate 100 is bent at the bending area BA such that the first and second protection film bases 171 and 172 face each other.

In such a display apparatus, the second end MPP2 of the multipath portion MPP in a direction from the first area 1A to the second area 2A may be disposed farther from the center of the bending area BA than the end PF2 of the second protection film base 172 facing the center of the bending area BA. Accordingly, the portion of the first conductive layer 215c corresponding to the end PF2 of the second protection film base 172 facing the center of the bending area BA may be part of the multipath portion MPP, and thus a situation, in which an electric signal is not transmitted due to disconnection of the first conductive layer 215c, may be effectively prevented.

According to exemplary embodiments of the present invention, as described above, a display apparatus capable of reducing the occurrence of defects during manufacture or in subsequent use may be manufactured.

While one or more exemplary embodiments of the present invention have been described with reference to the figures, it will be understood by one of ordinary skill in the art that various changes in form and details may be made therein without departing from the spirit and scope of the present disclosure.

What is claimed is:

1. A display apparatus, comprising:
   a substrate having a first area, a second area, and a third area disposed therebetween, the substrate being bent at the third area;
   an inorganic insulating layer disposed over the substrate and comprising an opening or groove overlapping the third area;
   an organic material layer filling the opening or groove; and
   a first conductive layer extending from the first area to the second area through the third area, disposed over the organic material layer, and comprising a multipath portion having a plurality of through holes, wherein a length of the multipath portion, in a direction from the first area to the second area, is greater than a width of the opening or groove, in the direction from the first area to the second area.

2. The display apparatus of claim 1, wherein an area of the opening or groove is greater than an area of the third area.

3. The display apparatus of claim 1, further comprising a second conductive layer disposed in either the first area or the second area at a different layer from that of the first conductive layer, the second conductive layer being electrically connected to the first conductive layer.

4. The display apparatus of claim 3, wherein a ductility of the first conductive layer is greater than a ductility of the second conductive layer.

5. The display apparatus of claim 3, wherein an end of the organic material layer in a direction from a center of the organic material layer to the second conductive layer is farther from the center of the organic material layer than a point where the first conductive layer and the second conductive layer contact each other.

6. The display apparatus of claim 1, wherein at least one of a first end of the multipath portion facing a center of the first area and a second end of the multipath portion in a direction from the first area to the second area is disposed over the inorganic insulating layer.

7. The display apparatus of claim 6, wherein the multipath portion overlaps the third area.

8. The display apparatus of claim 1, wherein a first end of the multipath portion facing a center of the first area and a second end of the multipath portion in a direction from the first area to the second area are disposed over the inorganic insulating layer.

9. The display apparatus of claim 8, wherein the multipath portion overlaps the third area.

10. The display apparatus of claim 1, wherein the plurality of through holes is arranged in a row along an extension direction of the first conductive layer.

11. The display apparatus of claim 10, wherein a first edge of the first conductive layer disposed at one side of an extension center axis of the first conductive layer comprises first concave portions corresponding to spaces between the plurality of through holes, and
a second edge of the first conductive layer disposed at another side of the extension center axis comprises second concave portions corresponding to the spaces between the plurality of through holes.

12. The display apparatus of claim 1, wherein the plurality of through holes are arranged along an extension direction of the first conductive layer, wherein the plurality of through holes comprises:
first through holes each of which has a center at one side of an extension center axis; and
second through holes each of which has a center at another side of the extension center axis.

13. The display apparatus of claim 12, wherein the first through holes and the second through holes are alternately arranged along the extension direction.

14. The display apparatus of claim 13, wherein a first edge of the first conductive layer at the one side of the extension center axis comprises first concave portions corresponding to the plurality of second through holes, and
a second edge of the first conductive layer at the other side of the extension center axis comprises second concave portions corresponding to the plurality of first through holes.

15. The display apparatus of claim 1, further comprising a protection film disposed over a bottom surface of the substrate, the protection film comprising a first protection film base disposed over the bottom surface of the substrate and corresponding to at least a part of the first area, and a first adhesive layer disposed between the substrate and the first protection film base.

16. The display apparatus of claim 15, wherein a first end of the multipath portion facing a center of the first area is disposed farther from a center of the third area than an end of the first protection film base facing the center of the third area.

17. The display apparatus of claim 15, wherein the protection film further comprises:
a second protection film base that is spaced apart from the first protection film base and is disposed over the bottom surface of the substrate and corresponding to at least a part of the second area, and
a second adhesive layer disposed between the substrate and the second protection film base.

18. The display apparatus of claim 17, wherein a second end of the multipath portion is disposed farther from a center of the third area, in a direction from the first area to the second area, than an end of the second protection film base facing the center of the third area.

* * * * *